United States Patent
Chen

(10) Patent No.: US 10,319,521 B2
(45) Date of Patent: Jun. 11, 2019

(54) CONDUCTOR-INSULATOR-CONDUCTOR CAPACITOR AND METHOD OF FABRICATING THE SAME

(71) Applicant: United Microelectronics Corp., Hsinchu (TW)

(72) Inventor: Lu Chen, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/607,275

(22) Filed: May 26, 2017

(65) Prior Publication Data

US 2018/0308635 A1   Oct. 25, 2018

(30) Foreign Application Priority Data

Apr. 25, 2017  (TW) .............................. 106113685 A

(51) Int. Cl.
| | |
|---|---|
| *H01G 4/33* | (2006.01) |
| *H01L 49/02* | (2006.01) |
| *H01G 4/005* | (2006.01) |
| *H01G 4/10* | (2006.01) |

(52) U.S. Cl.
CPC .............. *H01G 4/005* (2013.01); *H01G 4/10* (2013.01); *H01G 4/33* (2013.01); *H01L 28/60* (2013.01)

(58) Field of Classification Search
None
See application file for complete search history.

(56) References Cited

U.S. PATENT DOCUMENTS

| | | | |
|---|---|---|---|
| 6,977,198 B2 | 12/2005 | Gau | |
| 7,078,310 B1 | 7/2006 | Kar-Roy et al. | |
| 9,305,994 B2* | 4/2016 | Zhou | H01L 28/60 |
| 9,368,392 B2* | 6/2016 | Tseng | H01L 23/481 |
| 9,391,016 B2* | 7/2016 | Shen | H01L 23/5223 |
| 9,627,312 B2* | 4/2017 | Childs | H01L 23/5226 |
| 2007/0063240 A1* | 3/2007 | Torres | H01L 27/0688 |
| | | | 257/296 |
| 2008/0265371 A1* | 10/2008 | Park | H01G 4/33 |
| | | | 257/532 |
| 2010/0246092 A1* | 9/2010 | Shibue | H01G 4/232 |
| | | | 361/313 |
| 2010/0279484 A1 | 11/2010 | Wang et al. | |

(Continued)

*Primary Examiner* — Dion Ferguson
(74) *Attorney, Agent, or Firm* — J.C. Patents

(57) ABSTRACT

A conductor-insulator-conductor capacitor and a method of fabricating the same are provided. The conductor-insulator-conductor capacitor includes first to third conductive layers and first and second insulating layers. The first insulating layer is located on the first conductive layer and covers the first conductive layer. The second conductive layer is located on the first insulating layer and covers at least a portion of the first insulating layer. The second insulating layer is located on the second conductive layer and covers the top surface and the sidewall of the second conductive layer. The second conductive layer is surrounded and encapsulated by the first insulating layer and the second insulating layer. The third conductive layer is located on the second insulating layer and covers the sidewalls of the second insulating layer and the first conductive layer. The third conductive layer is in physical contact with and electrically connected to the first conductive layer.

18 Claims, 8 Drawing Sheets

(56) References Cited

U.S. PATENT DOCUMENTS

| | | | |
|---|---|---|---|
| 2012/0199946 A1* | 8/2012 | Kageyama | H01L 28/60 257/532 |
| 2013/0270675 A1* | 10/2013 | Childs | H01L 23/5226 257/532 |
| 2013/0320493 A1* | 12/2013 | Chang | H01L 21/02 257/532 |
| 2014/0159200 A1* | 6/2014 | Loke | H01L 23/5223 257/532 |
| 2015/0295019 A1* | 10/2015 | Wang | H01L 27/0805 257/532 |
| 2015/0295020 A1* | 10/2015 | Tseng | H01L 23/481 257/532 |
| 2016/0172113 A1* | 6/2016 | Reig | H01G 4/33 361/278 |
| 2018/0012954 A1* | 1/2018 | Kurachi | H01L 28/60 |

* cited by examiner

CONDUCTOR-INSULATOR-CONDUCTOR CAPACITOR AND METHOD OF FABRICATING THE SAME

CROSS REFERENCE TO RELATED APPLICATION

This application claims the priority benefits of Taiwan application serial no. 106113685, filed on Apr. 25, 2017. The entirety of the above-mentioned patent application is hereby incorporated by reference herein and made a part of specification.

FIELD OF THE PRESENT INVENTION

The present invention is related to a conductor-insulator-conductor capacitor and a method of fabricating the same.

DESCRIPTION OF RELATED ART

In integrated circuits, capacitors include meta-semiconductor-oxide (MOS) capacitors, PN junction capacitors, polysilicon-insulator-polysilicon (PIP) capacitor and metal-insulator-metal (MIM) capacitors. At least one electrode of each of the listed capacitors, except MIM capacitors, is made by a single-crystalline silicon or polysilicon. However, when a bias voltage is applied to a single-crystalline silicon or polysilicon electrode, a depletion region may be formed on such electrode. Therefore, the applied voltage is unstable, and the capacitance of the electrode is unable to maintain at the same standard.

A MIM capacitor has lower voltage coefficient of capacitance (VCC) and lower temperature coefficient of capacitance (TCC), so it has been widely applied to integrated circuits. As the semiconductor process is continuously developed, the dimension of a device is getting smaller and the level of integration is getting higher. Accordingly, how to increase the capacitance density of a conductor-insulator-conductor capacitor has become an important issue.

SUMMARY OF THE PRESENT INVENTION

The present invention provides a conductor-insulator-conductor capacitor and a method of fabricating the same. The conductor-insulator-conductor capacitor is formed with a higher capacitance density, and can be integrated with the existing processes.

The present invention provides a conductor-insulator-conductor capacitor that includes a first conductive layer, a first insulating layer, a second conductive layer, a second insulating layer and a third conductive layer. The first insulating layer is located on the first conductive layer and covers the first conductive layer. The second conductive layer is located on the first insulating layer and covers at least a portion of the first insulating layer. The second insulating layer is located on the second conductive layer and covers a top surface and a sidewall of the second conductive layer, wherein the second conductive layer is surrounded and encapsulated by the first insulating layer and the second insulating layer. The third conductive layer is located on the second insulating layer and covers sidewalls of the second insulating layer and the first conductive layer, wherein the third conductive layer is in physical contact with and electrically connected to the first conductive layer.

According to an embodiment of the present invention, an area of the third conductive layer is greater than an area of the first conductive layer, and the area of the first conductive layer is greater than an area of the second conductive layer.

According to an embodiment of the present invention, the third conductive layer includes a stepped structure and a top part. The stepped structure is located aside the first conductive layer and the second conductive layer and includes, from bottom to top, a first stepped portion and a second stepped portion. The top part is located above the second conductive layer and electrically connected to the second stepped portion of the stepped structure, wherein the top part has an opening that exposes a portion of the second insulating layer.

According to an embodiment of the present invention, the conductor-insulator-conductor capacitor further includes a first plug and a second plug. The first plug penetrates through the opening and the second insulating layer, and is electrically connected to the second conductive layer. The second plug is electrically connected to the stepped structure.

According to an embodiment of the present invention, the second plug is landed on the first stepped portion of the stepped structure.

According to an embodiment of the present invention, the second plug is landed on the second stepped portion of the stepped structure.

According to an embodiment of the present invention, the conductor-insulator-conductor capacitor further includes a third plug landed on the first stepped portion of the stepped structure.

The present invention further provides a conductor-insulator-conductor capacitor that includes an inner electrode, an outer electrode and an intermediate dielectric layer. The outer electrode has a stepped shape and surrounds and encapsulates a top surface, a bottom surface and a sidewall of the inner electrode. The outer electrode includes a bottom part located below the inner electrode, a top part located above the inner electrode, and a stepped structure located aside the inner electrode and connected to the bottom part and the top part. The intermediate dielectric layer is located between the inner electrode and the outer electrode and surrounds the inner electrode, such that the inner electrode is electrically isolated from the outer electrode.

According to an embodiment of the present invention, the stepped structure includes, from bottom to top, a first stepped portion and a second stepped portion, the first stepped portion is located aside the bottom part, and the second stepped portion is located aside the inner electrode.

According to an embodiment of the present invention, the conductor-insulator-conductor capacitor further includes a first plug and a second plug, wherein the top part has an opening that exposes a portion of the intermediate dielectric layer above the inner electrode. The first plug penetrates through the opening and the intermediate dielectric layer and is electrically connected to the inner electrode. The second plug is electrically connected to the stepped structure.

According to an embodiment of the present invention, the second plug is landed on the first stepped portion of the stepped structure.

According to an embodiment of the present invention, the second plug is landed on the second stepped portion of the stepped structure.

According to an embodiment of the present invention, the conductor-insulator-conductor capacitor further includes a third plug landed on the first stepped portion of the stepped structure.

The present invention also provides a method of fabricating a conductor-insulator-conductor capacitor that includes the following steps. A first conductive material layer is formed above a substrate. A first insulating material layer is formed on the first conductive material layer. A second conductive material layer is forming on the first insulating material layer. The second conductive material layer is patterned to form a second conductive layer. A second insulating layer is formed, wherein the second insulating layer covers a top surface and a sidewall of the second conductive layer. The first insulating material layer and the first conductive material layer are patterned to form a first insulating layer and a first conductive layer. A third conductive material layer is formed, wherein the third conductive layer covers sidewalls of the second insulating layer and the first conductive layer, and is in physical contact with and electrically connected to the first conductive layer. The third conductive material layer is patterned to form a third conductive layer.

According to an embodiment of the present invention, an area of the second conductive layer is less than an area of the first conductive layer, such that the third conductive layer is formed in a stepped shape and includes a stepped structure and a top part. The stepped structure is located aside the first conductive layer and the second conductive layer and includes, from bottom to top, a first stepped portion and a second stepped portion. The top part is located above the second conductive layer and electrically connected to the second stepped portion of the stepped structure.

According to an embodiment of the present invention, the third conductive layer has an opening that exposes a portion of the second insulating layer on the second conductive layer.

According to an embodiment of the present invention, the method further includes forming a first plug and a second plug, wherein the first plug penetrates through the opening and the second insulating layer and is landed on the second conductive layer, and the second plug is landed on the stepped structure.

According to an embodiment of the present invention, the second plug is landed on the first stepped portion of the stepped structure.

According to an embodiment of the present invention, the second plug is landed on the second stepped portion of the stepped structure.

According to an embodiment of the present invention, the method further includes forming a third plug landed on the first stepped portion of the stepped structure.

In view of the above, in the conductor-insulator-conductor capacitor of the present invention, the outer electrode is constituted by two conductive layers and covers the sidewall and the top and bottom surfaces of the inner electrode. Such disposition can improve the capacitance density of the capacitor.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1G are cross-sectional views of a method of fabricating a conductor-insulator-conductor capacitor according to a first embodiment of the present invention, wherein FIG. 1G is a cross-sectional view taken along line A-A' of FIG. 4.

DETAILED DESCRIPTION OF DISCLOSED EMBODIMENTS

Figure 1A:
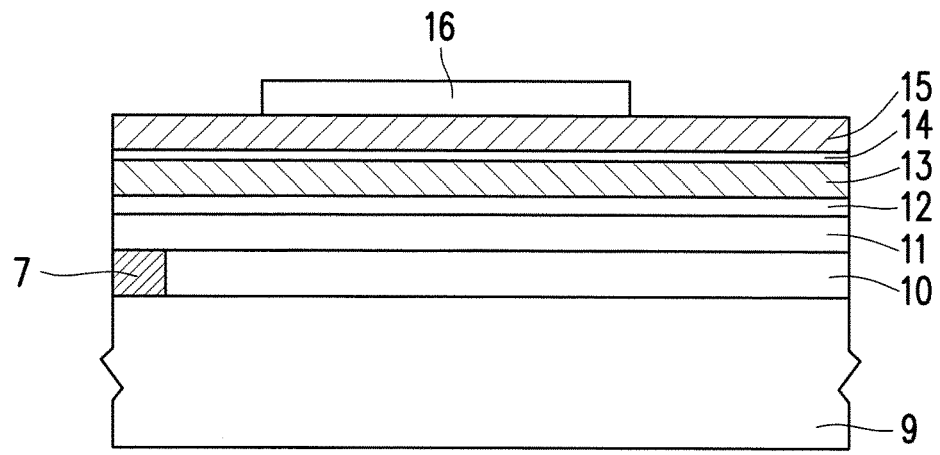

Examples of the exemplary embodiments of the present invention will be described in detail with reference to the accompanying drawings. In the various embodiments, like reference numerals are used to denote like elements. For the sake of brevity, the materials and forming methods are not iterated for like elements. In addition, the drawings of the present invention are schematic only and are not drawn to actual proportions.

The conductor-insulator-conductor capacitor of the present invention can be disposed in a semiconductor device. In the following embodiments, the conductor-insulator-conductor capacitor of the present invention is disposed between conductive lines at different levels of a multi-level metal interconnection. However, the present invention is not limited thereto. In alternative embodiments, the conductor-insulator-conductor capacitor of the present invention can be disposed between the substrate and the conductive line at the first level. The details are illustrated below.

Figure 4:
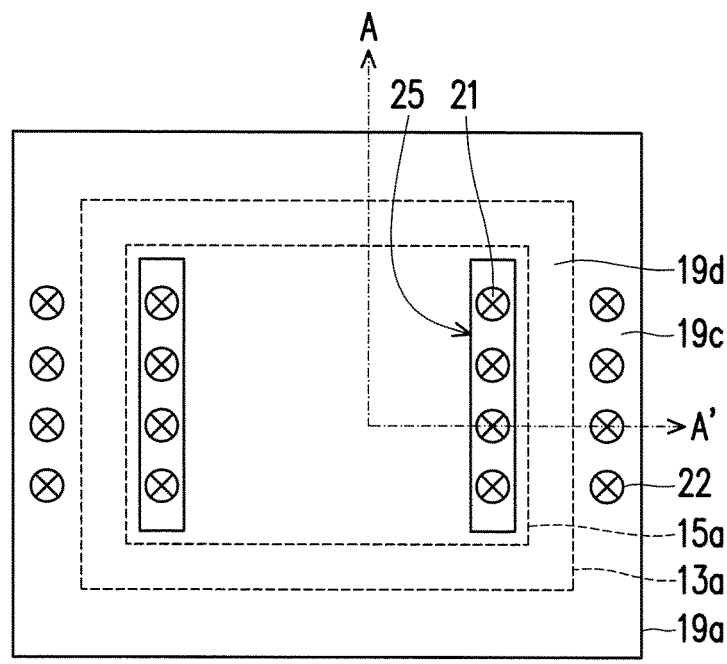
FIG. 4 is a top view of the conductor-insulator-conductor capacitor according to the first embodiment of the present invention.

FIG. 1A to FIG. 1G are cross-sectional views of a method of fabricating a conductor-insulator-conductor capacitor according to a first embodiment of the present invention. FIG. 4 is a top view of the conductor-insulator-conductor capacitor according to the first embodiment of the present invention.

Referring to FIG. 1A, a substrate 9 is provided. The substrate 9 can be a semiconductor substrate. The semiconductor substrate can be a doped silicon substrate, an undoped silicon substrate or an insulator-on-silicon (SOI) substrate. The doped silicon substrate can include a P-type dopant, an N-type dopant or a combination thereof. The substrate 9 has a dielectric layer 10 formed thereon. In some embodiments, the dielectric layer 10 is located on the substrate 9 and covers the surface of the substrate 9. In some embodiments, multiple elements are further included between the substrate 9 and the dielectric layer 10, and these elements are not show in the drawings for the sake of brevity. In some embodiments, the dielectric layer 10 is an inter-layer dielectric (ILD) layer. In alternative embodiments, the dielectric layer 10 is an inter-metal (IMD) dielectric layer, and the dielectric layer 10 has a conductive line 7 (or called a metal line) therein. The conductive line 7 is one of multiple conductive lines of a multi-level metal interconnection on the substrate 9. In other words, in some embodiments, the conductive line 7 is a conductive line at the n-th level of the multi-level metal interconnection, and is not the topmost metal layer of the multi-level metal interconnection.

Continue referring to FIG. 1A, a dielectric layer 11 is formed on the conductive line 7. The dielectric layer 11 includes a dielectric material, such as silicon oxide, tetraethylorthosilicate (TEOS) silicon oxide, silicon nitride, silicon oxynitride, undoped silicon glass (USG), borophosphosilicate glass (BPSG), phosphosilicate glass (PSG), a low-k material having a dielectric constant less than 4 or a combination thereof. The low-k material includes fluorine-doped silicon glass (FSG); silicon oxide such as hydrogen silsesquioxnane (HSQ), methyl silsesquioxane (MSQ) mixed with hybrido-organo siloxane polymer (HOSP); aromatic hydrocarbon such as SiLK; organosilicate glass such as black diamond (BD), 3MS, 4MS; parylene; fluoro-polymer such as PFCB, CYTOP, Teflon; poly(arylethers) such as PAE-2, FLARE; porous polymer such as XLK, Nanofoam, Awrogel; Coral or the like. The method of forming the dielectric layer 11 includes performing a CVD process or a spin-coating process. Thereafter, a dielectric material layer 12 is formed on the dielectric layer 11. The dielectric material layer 12 and the dielectric layer 11 include the same or different materials. The dielectric material layer 12 includes silicon oxide, silicon nitride, silicon oxynitride or a combination thereof, and the forming method thereof includes performing a CVD process. In some embodiments, the dielectric material layer 12 and the dielectric layer 11 are made by different materials and both serve as etch stop layers.

Continue referring to FIG. 1A, a first conductive material layer 13 is formed on the dielectric material layer 12. The first conductive material layer 13 can be a single-layer or multi-layer structure. The first conductive material layer 13 includes a metal, a metal alloy, a metal nitride, a metal silicide, a graphene or a combination thereof. The metal and the metal alloy includes copper, aluminum, titanium, tantalum, tungsten, platinum, chromium, molybdenum or an alloy thereof. In some exemplary embodiments, the metal alloy includes a copper-aluminum alloy or a titanium-platinum-gold alloy. The metal nitride includes titanium nitride, tungsten nitride, tantalum nitride, TaSiN, TiSiN, WSiN or a combination thereof. The metal silicide includes tungsten silicide, titanium silicide, cobalt silicide, zirconium silicide, platinum silicide, molybdenum silicide, copper silicide, nickel silicide or a combination thereof. The method of forming the first conductive material layer 13 includes performing a CVD process or a PVD process. The thickness of the first conductive material layer 13 ranges from about 600 angstroms to 1,500 angstroms.

Thereafter, a first insulating material layer 14 is formed on the first conductive material layer 13. The first insulating material layer 14 includes oxide, nitride, oxynitride or a high-k material. The first insulating material layer 14 includes silicon oxide, silicon nitride, silicon oxynitride, an oxide-nitride-oxide (ONO) structure, a high-k material having a dielectric constant greater than 4, greater than 7 or even greater than 10, or a combination thereof. The high-k material can be a metal oxide, such as rare earth metal oxide. For example, the high-k material includes hafnium oxide ($HfO_2$), hafnium silicon oxide (HfSiO), hafnium silicon oxynitride (HfSiON), aluminum oxide ($Al_2O_3$), yttrium oxide ($Y_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT) or a combination thereof. The method of forming the first insulating material layer 14 includes performing a CVD process. The thickness of the first insulating material layer 14 ranges from about 50 angstroms to 600 angstroms. In some exemplary embodiments, the thickness of the first insulating material layer 14 ranges from about 300 angstroms to 600 angstroms.

Continue referring to FIG. 1A, a second conductive material layer 15 is formed on the first insulating material layer 14. The second conductive material layer 15 can be a single-layer or multi-layer structure. The second conductive material layer 15 and the first conductive material layer 13 include the same or different materials. The second conductive material layer 15 includes a metal, a metal alloy, a metal nitride, a metal silicide, a graphene or a combination thereof. The metal and the metal alloy includes copper, aluminum, titanium, tantalum, tungsten, platinum, chromium, molybdenum or an alloy thereof. In some exemplary embodiments, the metal alloy includes a copper-aluminum alloy or a titanium-platinum-gold alloy. The metal nitride includes titanium nitride, tungsten nitride, tantalum nitride, TaSiN, TiSiN, WSiN or a combination thereof. The metal silicide includes tungsten silicide, titanium silicide, cobalt silicide, zirconium silicide, platinum silicide, molybdenum silicide, copper silicide, nickel silicide or a combination thereof. The method of forming the second conductive material layer 15 includes performing a CVD process or a PVD process. The thickness of the second conductive material layer 15 ranges from about 600 angstroms to 1,500 angstroms. The second conductive material layer 15 has a thickness the same as or different from that of the first conductive material layer 13.

Thereafter, a patterned mask layer 16 is formed on the second conductive material layer 15. The patterned mask layer 16 exposes a portion of the second conductive material layer 15. The patterned mask layer 16 can be a photoresist layer. The patterned mask layer 16 is formed by coating a photoresist layer on the substrate 9, and performing exposure and development steps to the photoresist layer.

Figure 1B:
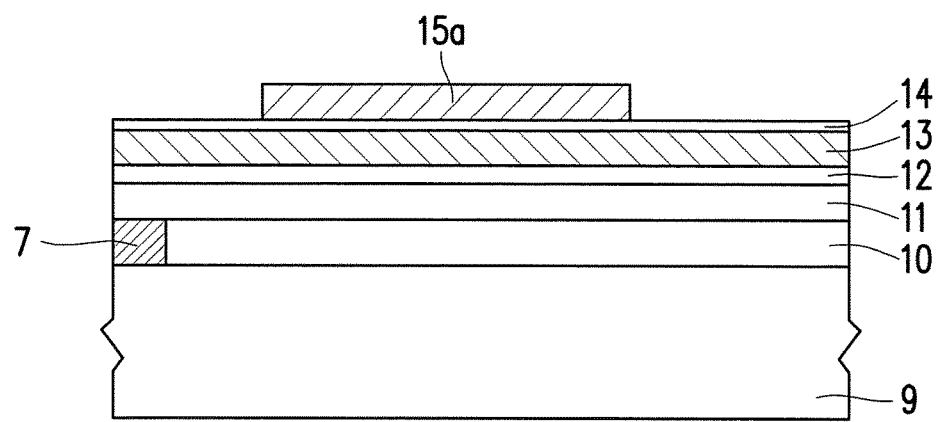

Referring to FIG. 1A to FIG. 1B, the second conductive material layer 15 is patterned by using the patterned mask layer 16 as a mask, so as to form a second conductive layer 15a that exposes a portion of the first insulating material layer 14. The method of patterning the second conductive material layer 15 includes performing an etching process, such as an isotropic etching process. The patterned mask layer 16 is then removed.

Figure 1C:
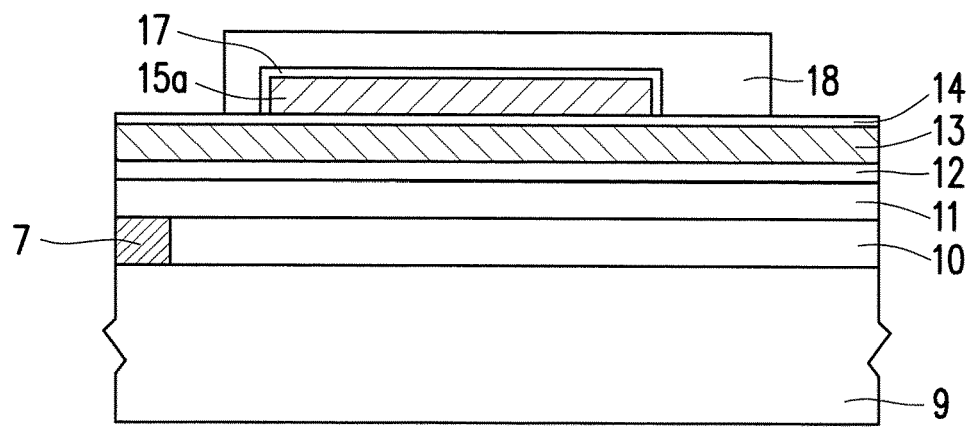

Referring to FIG. 1C, a second insulating layer 17 is formed on the substrate 9 and covers the top surface and sidewall of the second conductive layer 15a. In some embodiments (not shown), the second insulating layer 17 further covers the exposed surface of the first insulating material layer 14. The second insulating layer 17 and the first insulating material layer 14 include the same or different materials. The second insulating layer 17 includes oxide, nitride, oxynitride or a high-k material. The second insulating material layer 17 includes silicon oxide, silicon nitride, silicon oxynitride, an oxide-nitride-oxide (ONO) structure, a high-k material having a dielectric constant greater than 4, greater than 7 or even greater than 10, or a combination thereof. The high-k material can be a metal oxide, such as rare earth metal oxide. For example, the high-k material includes hafnium oxide ($HfO_2$), hafnium silicon oxide (HfSiO), hafnium silicon oxynitride (HfSiON), aluminum oxide ($Al_2O_3$), yttrium oxide ($Y_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT) or a combination thereof. The method of forming the second insulating layer 17 includes performing a CVD process. The thickness of the second insulating layer 17 ranges from about 50 angstroms to 600 angstroms. In some exemplary embodiments, the thickness of the first insulating material layer 14 ranges from about 300 angstroms to 600 angstroms. The second insulating layer 17 has a thickness the same as or different from that of the first insulating material layer 14.

Continue referring to FIG. 1C, a patterned mask layer 18 is formed on the substrate 9. In this embodiment, the area of the patterned mask layer 18 is greater than the area of the second conductive layer 15a, and therefore, the patterned mask layer 18 covers the top surface and the sidewall of the second conductive layer 17 and a portion of the top surface of the first insulating material layer 14. The patterned mask layer 18 can be a patterned photoresist layer. The patterned mask layer 18 is formed by coating a photoresist layer on the substrate 9, and performing exposure and development steps to the photoresist layer.

Figure 1D:
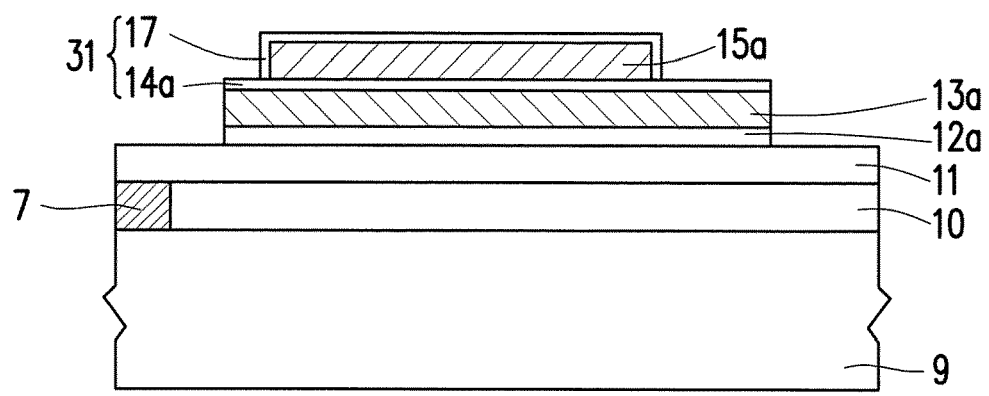

Referring to FIG. 1C and FIG. 1D, the first insulating material layer 14 and the underlying first conductive material layer 13 and dielectric material layer 12 are patterned (e.g., etched) by using the patterned mask layer 18 as a mask, so as to form a first insulating layer 14a, a first conductive layer 13a and a dielectric layer 12a. The patterned mask layer 18 is then removed. The etching step includes performing an anisotropic etching process. In this embodiment, the etching step is performed until the dielectric material layer 12 is removed and patterned to form the dielectric layer 12a; that is, the surface of the dielectric layer 11 is exposed upon the etching step. However, the present invention is not limited thereto. In alternative embodiments (not shown), the etching step is performed until the surface of the dielectric layer 12 is exposed; that is, the surface of the dielectric layer 11 is not exposed upon the etching step. The patterned mask layer 18 is then removed. The second conductive layer 15a is located above the first conductive layer 13a, and the area thereof is smaller than the area of the first conductive layer 13a. The first insulating layer 14a covers the top surface of the first conductive layer 13a, and exposes the sidewall of the first conductive layer 13a. The second insulating layer 17 encapsulates the top surface and the sidewall of the second conductive layer 15a, and the first insulating layer 14a encapsulates the bottom surface of the second conductive layer 15a. In other words, the first insulating layer 14a and the second insulating layer 17 constitutes an intermediate dielectric layer 31 that surrounds and encapsulates the second conductive layer 15a.

Referring to FIG. 1D, in alternative embodiments (not shown), a portion of first insulating layer 14a on the first conductive layer 13a and uncovered by the second conductive layer 15a can be further removed by another etching process, such that a portion of the top surface of the first conductive layer 13a is exposed.

Figure 1E:
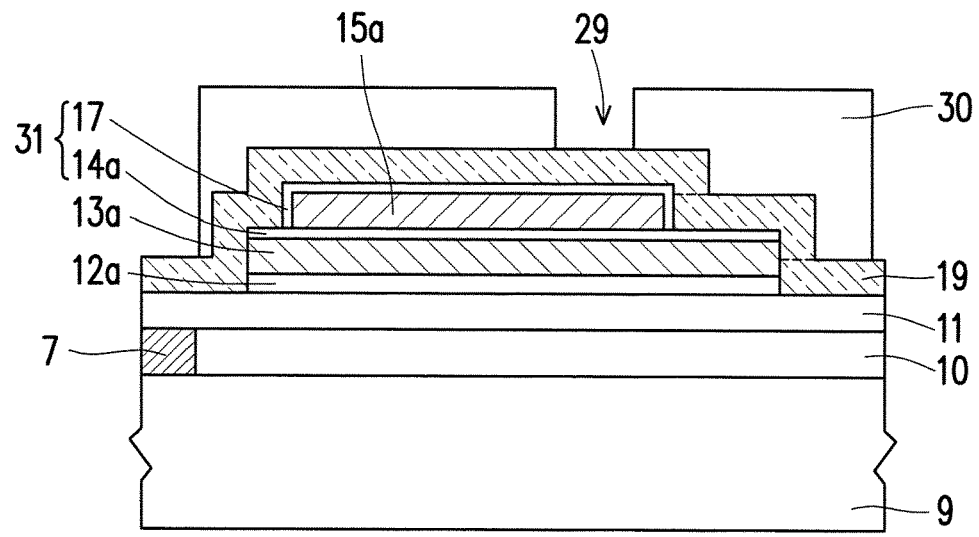

Referring to FIG. 1E, a third conductive material layer 19 is formed on the substrate 9 and covers the top surface and the sidewall of the second insulating layer 17, the top surface and the sidewall of the first insulating layer 14a, the sidewalls of the first conductive layer 13a and the dielectric layer 12a, and the surface of the dielectric layer 11. The third conductive material layer 19 can be a single-layer or multi-layer structure. The third conductive material layer 19 and the first conductive layer 13a or the second conductive layer 15a include the same or different materials. The third conductive material layer 19 includes a metal, a metal alloy, a metal nitride, a metal silicide, a graphene or a combination thereof. The metal and the metal alloy includes copper, aluminum, titanium, tantalum, tungsten, platinum, chromium, molybdenum or an alloy thereof. In some exemplary embodiments, the metal alloy includes a copper-aluminum alloy or a titanium-platinum-gold alloy. The metal nitride includes titanium nitride, tungsten nitride, tantalum nitride, TaSiN, TiSiN, WSiN or a combination thereof. The metal silicide includes tungsten silicide, titanium silicide, cobalt silicide, zirconium silicide, platinum silicide, molybdenum silicide, copper silicide, nickel silicide or a combination thereof. The method of forming the third conductive material layer 19 includes performing a CVD process or a PVD process. The thickness of the third conductive material layer 19 ranges from 600 angstroms to 1,500 angstroms. The third conductive material layer 19 has a thickness the same as or different from that of the first conductive layer 13a or the second conductive layer 15a. In some embodiments, the area of the second conductive layer 15a is less than the area of the first conductive layer 13a, such that the third conductive material layer 19 is formed in a stepped shape.

Continue referring to FIG. 1E, a patterned mask layer 30 is formed on the third conductive material layer 19. In some embodiments, the area of the patterned mask layer 30 is greater than the area of the first conductive layer 13a, and the patterned mask layer 30 covers a portion of the third conductive material layer 19 on the dielectric layer 11, the first conductive layer 13a and the second conductive layer 15a. Besides, the patterned mask layer 30 has an opening 29. The opening 29 exposes a portion of the third conductive material layer 19 above the second conductive layer 15a. The patterned mask layer 30 can be a patterned photoresist layer. The patterned mask layer 30 is formed by coating a photoresist layer on the third conductive material layer 19, and performing exposure and development steps to the photoresist layer.

Figure 1F:
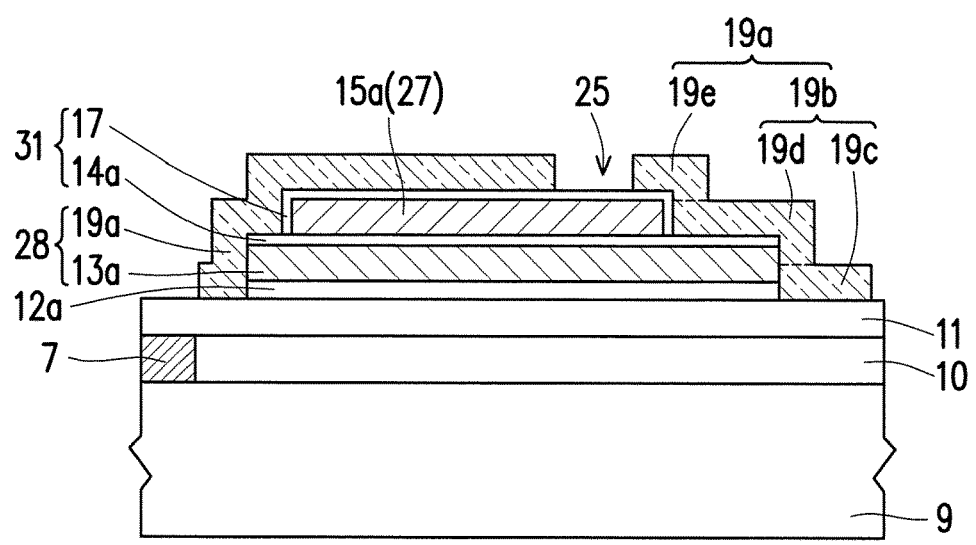

Referring to FIG. 1E to FIG. 1F, the third conductive material layer 19 is patterned by using the patterned mask layer 30 as a mask, so as to form a third conductive layer 19a. The patterned mask layer 30 is then removed. The patterning step includes performing an etching process, such as an anisotropic etching process.

Referring to FIG. 1F, the third conductive layer 19a is located on the dielectric layer 11, covers the top surface and the sidewall of the second insulating layer 17, the top surface and the sidewall of the first insulating layer 14a, and the sidewalls of the first conductive layer 13a and the dielectric layer 12a. Besides, the third conductive layer 19a is in physical contact with and electrically connected to the sidewall of the first conductive layer 13a. The third conductive layer 19a includes a top part 19e and a stepped structure 19b electrically connected to each other. The top part 19e is located above the second conductive layer 15a and has an opening 25 that exposes a portion of the second insulating layer 17. The stepped structure 19b is located aside the first conductive layer 13a and the second conductive layer 15a and includes, from bottom to top, a first stepped portion 19c and a second stepped portion 19d. The first stepped portion 19c is located on the dielectric layer 11, and is aside and in physical contact with the first conductive layer 13a and the dielectric layer 12. The second stepped portion 19d is electrically connected to the first stepped portion 19c and the top part 19e, and is located aside the second conductive layer 15a. Besides, the second stepped portion 19d covers the top surface and the sidewall of the first insulating layer 14a and is aside and in physical contact with the first conductive layer 13a. The heights of the top surfaces of the first stepped portion 19c and the second stepped portion 19d are related to the thickness of the third conductive material layer 19a. In some embodiments, the top surface of the first stepped portion 19c is lower than the top surface of the first conductive layer 13a, and the top surface of the second stepped portion 19d is substantially coplanar with the top surface of the second conductive layer 15a. However, the present invention is not limited thereto. In alternative embodiments, the top surface of the first stepped portion 19c can be higher than or as high as the top surface of the first conductive layer 13a. The top surface of the second stepped portion 19d can be lower than or higher than the top surface of the second conductive layer 15a.

Continue referring to FIG. 1F, the third conductive layer 19a is in physical contact with and electrically connected to the sidewall of the first conductive layer 13a, so the third conductive layer 19a and the first conductive layer 13a can together constitute an outer electrode 28. The second conductive layer 15a serves as inner electrode 27. The first insulating layer 14a and the second insulating layer 17 together constitute the intermediate dielectric layer 31. The outer electrode 28 has a stepped shape, and surrounds and encapsulates the top surface, the bottom surface and the sidewall of the inner electrode 27. The intermediate dielectric layer 31 is located between the inner electrode 27 and the outer electrode 28 and surrounds the inner electrode 27, such that the inner electrode 27 is electrically isolated from the outer electrode 28. In the outer electrode 28, the first conductive layer 13a serves as a bottom part of the outer electrode 28, and is located below the inner electrode 27. The outer electrode 28 further includes the top part 19e and the stepped structure 19b. The top part 19e is located above the inner electrode 27. The stepped structure 19b is located aside the inner electrode 27, and is electrically connected to the bottom part 13a and the top part 19e.

Figure 1G:
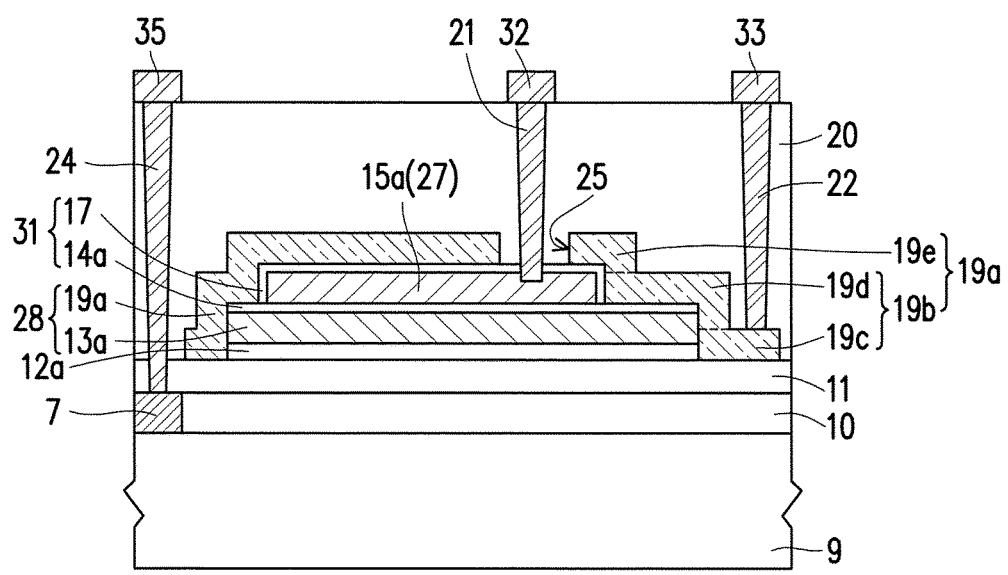

Referring to FIG. 1G, a dielectric layer 20 is formed on the substrate 9. The dielectric layer 20 covers the third conductive layer 19a and the dielectric layer 11, and fills in the opening 25. In some embodiments, the dielectric layer 20 is an inter-metal (IMD) dielectric layer. In alternative embodiments, the dielectric layer 20 is an inter-layer dielectric (ILD) layer. The dielectric layer 20 includes silicon oxide, tetraethylorthosilicate (TEOS) silicon oxide, silicon nitride, silicon oxynitride, undoped silicon glass (USG), borophosphosilicate glass (BPSG), phosphosilicate glass (PSG), a low-k material having a dielectric constant less than 4 or a combination thereof. The low-k material includes fluorine-doped silicon glass (FSG); silicon oxide such as hydrogen silsesquioxnane (HSQ), methyl silsesquioxane (MSQ) mixed with hybrido-organo siloxane polymer (HOSP); aromatic hydrocarbon such as SiLK; organosilicate glass such as black diamond (BD), 3MS, 4MS; parylene; fluoro-polymer such as PFCB, CYTOP, Teflon; poly(arylethers) such as PAE-2, FLARE; porous polymer such as XLK, Nanofoam, Awrogel; Coral or the like. The method of forming the dielectric layer 20 includes performing a CVD process, a spin-coating processor a combination thereof.

Continue referring to FIG. 1G, at least one first plug 21, at least one second plug 22 and at least one plug 24 are formed in the dielectric layer 20. Each of the first plug 21, the second plug 22 and the plug 24 can be a single-layer or multi-layer structure. Each of the first plug 21, the second plug 22 and the plug 24 includes a conductive material. The conductive material includes a metal, a metal alloy, a metal nitride, metal silicide or a combination thereof. The metal and the metal alloy includes copper, aluminum, titanium, tantalum, tungsten, platinum, chromium, molybdenum or an alloy thereof. In some exemplary embodiments, the metal alloy includes a copper-aluminum alloy or a titanium-platinum-gold alloy. The metal nitride includes titanium nitride, tungsten nitride, tantalum nitride, TaSiN, TiSiN, WSiN or a combination thereof. The metal silicide includes tungsten silicide, titanium silicide, cobalt silicide, zirconium silicide, platinum silicide, molybdenum silicide, copper silicide, nickel silicide or a combination thereof. The method of forming the conductive material includes performing a CVD process, a PVD processor a combination thereof. The method of forming the first plug 21, the second plug 22 and the plug 24 includes forming plug openings (or called contact holes) in the dielectric layer 20 by photolithography etching processes, and then filling a conductive material in the plug openings.

Continue referring to FIG. 1G, the first plug 21 penetrates through the dielectric layer 20, the opening 25 and the second insulating layer 17. The first plug 21 is landed on the second conductive layer 15a and in contact with the second conductive layer 15a. The second plug 22 penetrates through the dielectric layer 20, is landed on the first stepped portion 19c of the stepped structure 19b, and is in contact with the third conductive layer 19a. The plug 24 penetrates through the dielectric layer 20 and the dielectric layer 11, and is electrically connected to the conductive line 7. In other words, the first plug 21 penetrates through the dielectric layer 20, the opening 25 and the intermediate dielectric layer 31, and is electrically connected to the inner electrode 27. The second plug 22 penetrates through the dielectric layer 20 and is electrically connected to the outer electrode 28.

Thereafter, a conductive line 32, a conductive line 33 and a conductive line 35 are formed on the substrate 9. Each of the conductive line 32, the conductive line 33 and the conductive line 35 includes a conductive material. The conductive material includes a metal, a metal alloy, a metal nitride, a metal silicide or a combination thereof. The metal and the metal alloy includes copper, aluminum, titanium, tantalum, tungsten, platinum, chromium, molybdenum or an alloy thereof. In some exemplary embodiments, the metal alloy includes a copper-aluminum alloy or a titanium-platinum-gold alloy. The metal nitride includes titanium nitride, tungsten nitride, tantalum nitride, TaSiN, TiSiN, WSiN or a combination thereof. The metal silicide includes tungsten silicide, titanium silicide, cobalt silicide, zirconium silicide, platinum silicide, molybdenum silicide, copper silicide, nickel silicide or a combination thereof. The method of forming the conductive material includes performing a CVD process, a PVD processor a combination thereof. In some embodiments, the conductive line 32, the conductive line 33 and the conductive line 35 are formed after the step of forming the first plug 21, the second plug 22 and the plug 24. The method of forming the conductive line 32, the conductive line 33 and the conductive line 35 includes foil ling a conductive line material layer on the dielectric layer 20, and then patterning the conductive line material layer with photolithography etching processes. In alternative embodiments, the conductive line 32, the conductive line 33 and the conductive line 35 are formed simultaneously with the first plug 21, the second plug 22 and the plug 24, and the forming method thereof includes performing a dual-damascene process. The dual-damascene process includes foil ling plug openings and conductive line trenches above and corresponding to the plug openings in the dielectric layer with photolithography and etching processes, and then filling a conductive material in the plug openings and the conductive line trenches.

In some embodiments in which the conductive line 7 is a conductive line at the n-th level of the multi-level metal interconnection, the conductive line 32, the conductive line 33 and the conductive line 35 are at the (n+1)-th level of the multi-level metal interconnection. The conductive line 32 is electrically connected to the second conductive layer 15a (i.e., inner electrode 27) through the first plug 21. The conductive line 33 is electrically connected to the third conductive layer 19a and the first conductive layer 13a (i.e., outer electrode 28) through the second plug 22. The conductive line 35 is electrically connected to the conductive line 7 through the plug 24.

FIG. 4 is a top view of a conductor-insulator-conductor capacitor according to the first embodiment of the present invention. FIG. 1G is a cross-sectional view taken along line A-A' of FIG. 4. For the sake of brevity, the conductive line 32, the conductive line 34, the conductive line 35, the plug 24 and the dielectric layer 20 are not shown in FIG. 4.

Referring to FIG. 1G and FIG. 4, in the conductor-insulator-conductor capacitor, the area of the third conductive layer 19a is greater than the area of the first conductive layer 13a, and the area of the first conductive layer 13a is greater than the area of the second conductive layer 15a. Besides, from a top view, the second conductive layer 15a is within the boundary of the first conductive layer 13a, and the first conductive layer 13a is within the boundary of the third conductive layer 19a. In some embodiments, the first conductive layer 13a, the second conductive layer 15a and the third conductive layer 19a are rectangular in a top view. However, the present invention is not limited thereto. In alternative embodiments, the first conductive layer 13a, the second conductive layer 15a and the third conductive layer 19a can be, from a top view, striped, rounded, oval or a combination thereof.

In some embodiments, the third conductive layer 19a has symmetric portions of the stepped structure 19b at both sides thereof. In alternative embodiments, the third conductive layer 19a has asymmetric portions of the stepped structure 19b at both sides thereof. However, the present invention is not limited thereto. In alternative embodiments, the third conductive layer 19a has a stepped structure 19b only at one side thereof, and the sidewall thereof is substantially coplanar with the sidewall of the first conductive layer 13a at the other side thereof.

Continue referring to FIG. 1G and FIG. 4, the first plug 21 is located in the opening 25 above the second conductive layer 15a. In some embodiments, multiple first plugs 21 penetrate through the same opening 25. In some exemplary embodiments, multiple first plugs 21 are arranged in a column along one direction, and a spacing between the adjacent first plugs 21 substantially keeps constant. In other words, multiple first plugs 21 in the opening 25 are arranged orderly or regularly. However, the present invention is not limited thereto. Multiple first plugs 21 can be arranged in an irregular manner. Multiple second plug 22 can be arranged regularly or irregularly on first stepped portion 19c of the third conductive layer 19a. In alternative embodiments, the first plugs 21 and the second plugs 22 at one side (e.g., right side in FIG. 4) and those at the other side (e.g., right side in FIG. 4) are arranged in rows. However, the present invention is not limited thereto. In some exemplary embodiments, multiple first plugs 21 and multiple second plugs 22 are arranged in one or more arrays.

In the conductor-insulator-conductor capacitor of this embodiment, the outer electrode is constituted by two conductive layers and covers the sidewall and the top and bottom surfaces of the inner electrode. Such disposition can improve the capacitance density of the capacitor.

Figure 2:
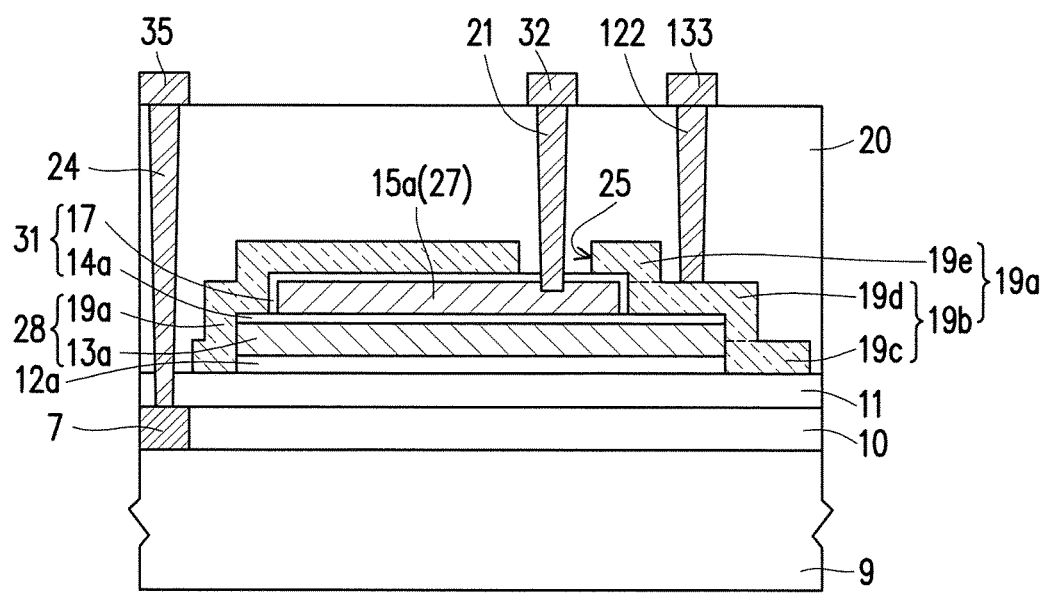
FIG. 2 is a cross-sectional view of a conductor-insulator-conductor capacitor according to a second embodiment of the present invention, and is a cross-sectional view taken along line A-A' of FIG. 5.
Figure 5:
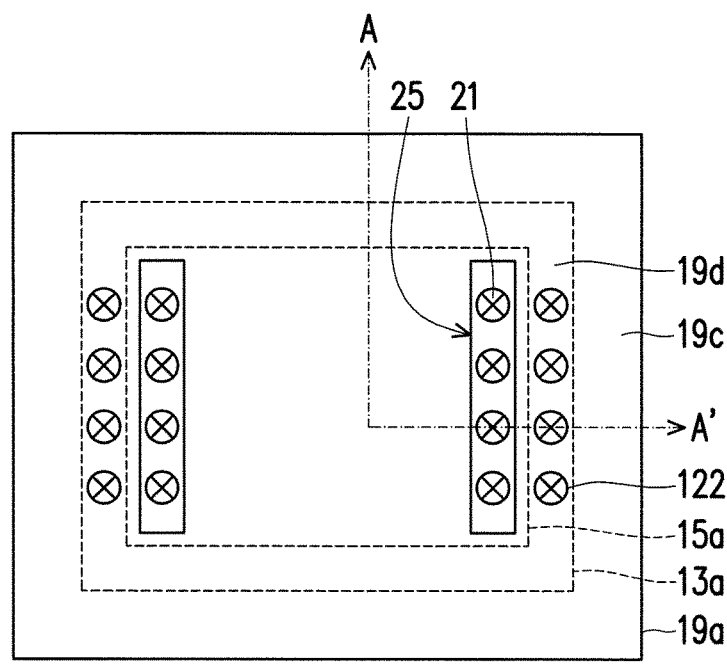
FIG. 5 is a top view of the conductor-insulator-conductor capacitor according to a second embodiment of the present invention.

FIG. 2 and FIG. 5 respectively illustrate cross-sectional and top views of a conductor-insulator-conductor capacitor according to a second embodiment of the present invention.

As shown in FIG. 2, after the step of forming the third conductive layer 19a in FIG. 1F, a dielectric layer 20 is formed on the substrate 9. Thereafter, first plugs 21, second plugs 122 and plugs 24 are formed in the dielectric layer 20. Afterwards, a conductive line 32, a conductive line 133 and a conductive line 35 are formed to electrically connect to the first plugs 21, the second plugs 122 and the plugs 24, respectively. The materials and forming methods of plugs and conductive lines are similar to those described in the first embodiment, so the details are not iterated herein. The difference between this embodiment and the first embodiment lies in that, the second plug 122 of this embodiment is landed on the second stepped portion 19d of the stepped structure 19b, while the second plug 22 of the first embodiment is landed on the first stepped portion 19c. In addition, the arrangements of plugs and conductive layers of each embodiment of the present invention is similar to those described in the first embodiment, so the details are not iterated herein. The difference between them are described in detail below.

Referring to FIG. 2 and FIG. 5, in this embodiment, the second plugs 122 are landed on the second stepped portion 19d of the stepped structure 19b, and are in contact with the third conductive layer 19a. In some embodiments, the second plugs 122 are landed on the second stepped portion 19d and correspond to the first conductive layer 13a. The conductive line 133 is electrically connected to outer electrode 28 through the second plugs 122.

In this embodiment, the second plugs are landed on the second stepped portion of the stepped structure. Thus, the stepped structure of the outer electrode helps to improve the flexibility for plug landing.

Figure 3:
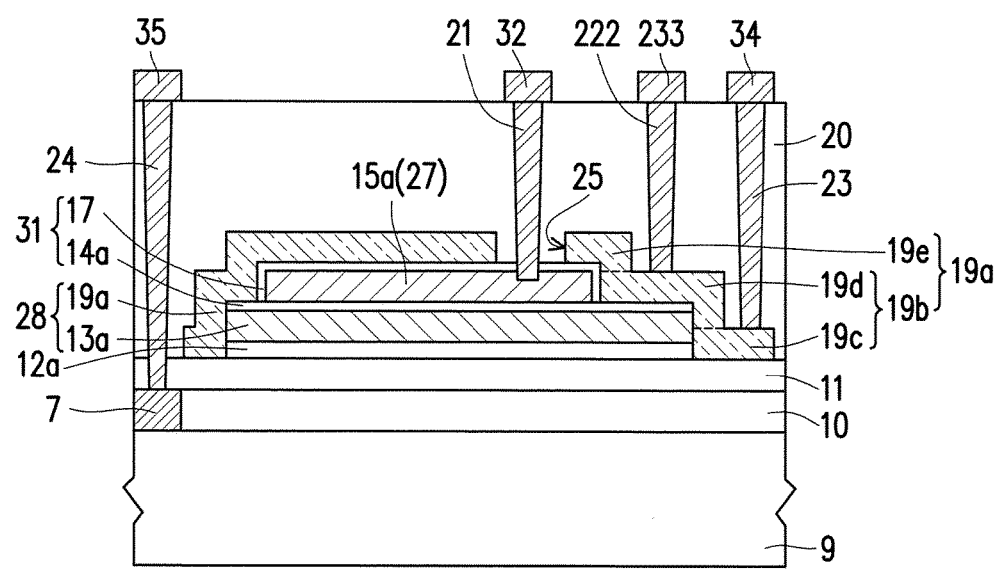
FIG. 3 is a cross-sectional view of a conductor-insulator-conductor capacitor according to a third embodiment of the present invention, and is a cross-sectional view taken along line A-A' of FIG. 6.
Figure 6:
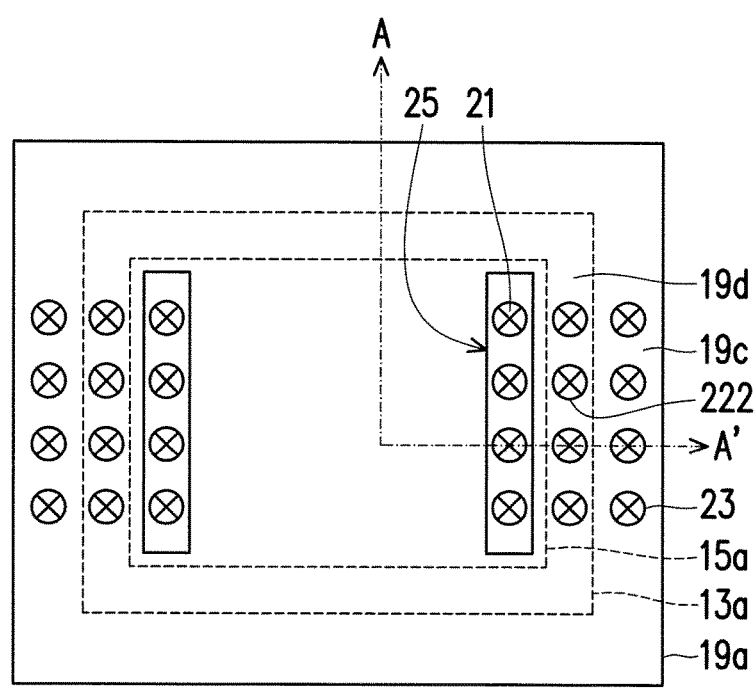
FIG. 6 is a top view of the conductor-insulator-conductor capacitor according to a third embodiment of the present invention.

FIG. 3 and FIG. 6 respectively illustrate cross-sectional and top views of a conductor-insulator-conductor capacitor according to a third embodiment of the present invention. As shown in FIG. 3, after the step of forming the third conductive layer 19a in FIG. 1F, a dielectric layer 20 is formed on the substrate 9. Thereafter, first plugs 21, second plugs 222, third plugs 23 and plugs 24 are formed in the dielectric layer 20. Thereafter, a conductive line 32, a conductive line 233, a conductive line 34 and a conductive line 35 are formed to electrically connect to the first plugs 21, the second plugs 222, the third plugs 23 and the plugs 24, respectively. The materials and forming methods of plugs and conductive lines are similar to those described in the first embodiment, so the details are not iterated herein. The difference between this embodiment and the first embodiment or the second embodiment lies in that, the plugs of this embodiment include second plugs 222 and third plugs 23 that are landed on steps at different levels of the stepped structure 19b. The details are illustrated below.

Referring to FIG. 3 and FIG. 6, in this embodiment, the second plugs 222 are landed on the second stepped portion 19d and correspond to the first conductive layer 13a. The third plugs 23 are landed on the first stepped portion 19c of the stepped structure 19b. The conductive line 233 and the conductive line 34 are electrically connected to the third conductive layer 19a (i.e., outer electrode 28) through the second plugs 222 and the third plugs 23, respectively. In some embodiments, the conductive line 233 is electrically connected to the conductive line 34 through the outer electrode 28. In alternative embodiments, the conductive line 33 is in physical contact with and electrically connected to the conductive line 34.

In this embodiment, plugs can be landed on steps at different levels of the stepped structure, so as to increase the conductivity between the outer electrode and the conductive lines, and therefore, the performance of the semiconductor device can be enhanced.

In summary, in the conductor-insulator-conductor capacitor of the present invention, two conductive layers together constitute an outer electrode, two insulating layers together constitute an intermediate dielectric layer, and the insulating layers each include a high-k material. Such disposition can effectively and synergistically increase the capacitance density of the capacitor. In some exemplary embodiments, the capacitance density can be up to about 40 to 60 fF/um$^2$ or even higher. Besides, the outer electrode has a stepped structure, so the flexibility for plug landing is increased. Besides, plugs can be landed on steps at different levels of the stepped structure, so as to increase the conductivity between the outer electrode and the conductive lines, and therefore, the performance of the semiconductor device can be enhanced.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A conductor-insulator-conductor capacitor, comprising:
a first conductive layer;
a first insulating layer, located on the first conductive layer and covering the first conductive layer;
a second conductive layer, located on the first insulating layer and covering at least a portion of the first insulating layer;
a second insulating layer, located on the second conductive layer and covering a top surface and a sidewall of the second conductive layer, wherein the second conductive layer is surrounded and encapsulated by the first insulating layer and the second insulating layer; and
a third conductive layer, located on the second insulating layer and covering a sidewall of the second insulating layer and a sidewall of the first conductive layer,
wherein the third conductive layer is in physical contact with and electrically connected to the first conductive layer, and
wherein the third conductive layer comprises:
a stepped structure, located aside the first conductive layer and the second conductive layer and comprising, from bottom to top, a first stepped portion and a second stepped portion; and
a top part, located above the second conductive layer and electrically connected to the second stepped portion of the stepped structure, wherein the top part has an opening that exposes a portion of the second insulating layer.

2. The conductor-insulator-conductor capacitor of claim 1, wherein an area of the third conductive layer is greater than an area of the first conductive layer, and the area of the first conductive layer is greater than an area of the second conductive layer.

3. The conductor-insulator-conductor capacitor of claim 1, further comprising:
a first plug, penetrating through the opening and the second insulating layer, and electrically connected to the second conductive layer; and
a second plug, electrically connected to the stepped structure.

4. The conductor-insulator-conductor capacitor of claim 3, wherein the second plug is landed on the first stepped portion of the stepped structure.

5. The conductor-insulator-conductor capacitor of claim 3, wherein the second plug is landed on the second stepped portion of the stepped structure.

6. The conductor-insulator-conductor capacitor of claim 5, further comprising a third plug landed on the first stepped portion of the stepped structure.

7. A conductor-insulator-conductor capacitor, comprising:
an inner electrode;
an outer electrode, having a stepped shape, surrounding and encapsulating a top surface, a bottom surface and a sidewall of the inner electrode and comprising:
a bottom part, located below the inner electrode;
a top part, located above the inner electrode; and
a stepped structure, located aside the inner electrode and connected to the bottom part and the top part; and
an intermediate dielectric layer, located between the inner electrode and the outer electrode and surrounding the inner electrode, such that the inner electrode is electrically isolated from the outer electrode.

8. The conductor-insulator-conductor capacitor of claim 7, wherein the stepped structure comprises, from bottom to top, a first stepped portion and a second stepped portion, the first stepped portion is located aside the bottom part, and the second stepped portion is located aside the inner electrode.

9. The conductor-insulator-conductor capacitor of claim 8, further comprising a first plug and a second plug, wherein the top part has an opening that exposes a portion of the intermediate dielectric layer above the inner electrode, and wherein
the first plug penetrates through the opening and the intermediate dielectric layer and is electrically connected to the inner electrode; and
the second plug is electrically connected to the stepped structure.

10. The conductor-insulator-conductor capacitor of claim 9, wherein the second plug is landed on the first stepped portion of the stepped structure.

11. The conductor-insulator-conductor capacitor of claim 9, wherein the second plug is landed on the second stepped portion of the stepped structure.

12. The conductor-insulator-conductor capacitor of claim 11, further comprising a third plug landed on the first stepped portion of the stepped structure.

13. A method of fabricating a conductor-insulator-conductor capacitor, comprising:
forming a first conductive material layer above a substrate;
forming a first insulating material layer on the first conductive material layer;
forming a second conductive material layer on the first insulating material layer;
patterning the second conductive material layer to form a second conductive layer;
forming a second insulating layer, wherein the second insulating layer covers a top surface and a sidewall of the second conductive layer;
patterning the first insulating material layer and the first conductive material layer to form a first insulating layer and a first conductive layer;
forming a third conductive material layer, wherein the third conductive layer covers a sidewall of the second insulating layer and a sidewall of the first conductive layer, and is in physical contact with and electrically connected to the first conductive layer; and patterning the third conductive material layer to form a third conductive layer, wherein an area of the second conductive layer is less than an area of the first conductive layer, such that the third conductive layer is formed in a stepped shape and comprises:

a stepped structure, located aside the first conductive layer and the second conductive layer and comprising, from bottom to top, a first stepped portion and a second stepped portion; and a top part, located above the second conductive layer and electrically connected to the second stepped portion of the stepped structure.

14. The method of claim 13, wherein the third conductive layer has an opening that exposes a portion of the second insulating layer on the second conductive layer.

15. The method of claim 14, further comprising forming a first plug and a second plug, wherein the first plug penetrates through the opening and the second insulating layer and is landed on the second conductive layer, and the second plug is landed on the stepped structure.

16. The method of claim 15, wherein the second plug is landed on the first stepped portion of the stepped structure.

17. The method of claim 15, wherein the second plug is landed on the second stepped portion of the stepped structure.

18. The method of claim 17, further comprising forming a third plug, wherein the third plug is landed on the first stepped portion of the stepped structure.

* * * * *